United States Patent [19]

Gilligan et al.

[11] 4,312,048

[45] Jan. 19, 1982

[54] MAGNETIC CORE MEMORY INHIBIT CURRENT DRIVER CIRCUIT

[75] Inventors: Thomas J. Gilligan, Rolling Hills Estates; James E. Smith, Anaheim, both of Calif.; Yun P. Wong, Kowloon, Hong Kong

[73] Assignee: Ampex Corporation, Redwood City, Calif.

[21] Appl. No.: 141,776

[22] Filed: Apr. 21, 1980

[51] Int. Cl.³ ............................................. G11C 11/06
[52] U.S. Cl. ................................................... 365/195
[58] Field of Search ................ 365/195, 196, 189, 191

[56] References Cited

U.S. PATENT DOCUMENTS 3,651,497  3/1972  Cook ................................... 365/191

Primary Examiner—James W. Moffitt
Attorney, Agent, or Firm—Gregory L. Roth; Joel D. Talcott

[57] ABSTRACT

A low cost, low power inhibit current drive circuit includes a pair of sense-inhibit conductors each inductively coupling 16K low drive memory cores and having sufficiently low resistance to permit steady state inhibit current magnitudes to be energized by a 5 volt source which is diode coupled thereto, a switch coupled to selectively pass inhibit current in response to a command signal, a storage capacitor coupled to the transistor collector, and a series combination of an inductor and a resistor coupled to charge the capacitor to a voltage greater than 5 volts and thus provide a rapid rise of inhibit current to the steady state level upon closure of the switch. Use of the charged capacitor to provide high voltage energy at switch closure reduces the required maximum current from the high voltage source while the inductor reduces capacitor charging time for a given size of series resistor to further reduce the maximum current requirement from the high voltage source.

10 Claims, 2 Drawing Figures

MAGNETIC CORE MEMORY INHIBIT CURRENT DRIVER CIRCUIT

BACKGROUND OF THE INVENTION

Three wire, 3D core memories provide an excellent combination of low cost and high speed and have therefore become very popular in recent years. In such memories X and Y drive wires are passed through the cores in orthogonal rows and columns. Each carries a half select current so that a core at an intersection of a selected X or row wire and a selected Y or column wire receives two half select currents for full selection. A different crossover is provided for each bit position of a memory. Thus, an 18 bit memory must have 18 crossovers for each combination of an X wire and a Y wire so that 18 cores are fully selected simultaneously.

A pair of sense-inhibit conductors is provided for each bit position and is inductively coupled to every core in the bit position, usually running parallel to the Y wires. Consequently, during a read cycle the separate sense-inhibit conductor pairs can separately sense core switching signals for each bit position. Similarly, during a write cycle half select current can be passed through any desired sense-inhibit conductor pairs in a direction opposite to the Y write current to cancel the Y write current at desired bit positions and prevent the switching of cores thereat. Those cores thus remain in the zero state while selected cores in bit positions which do not receive a partially cancelling inhibit current are switched to the one state.

Because the inhibit current driver circuitry must be duplicated at each bit position (i.e. 18 bit positions require 18 inhibit driver circuits) it is desirable to minimize the total cost and power consumption of such circuits in a memory. One technique which has been used to reduce cost is to utilize two parallel sense-inhibit conductors at each bit position, each inductively coupling half of the cores. Because core switching signal losses and time delays along a sense-inhibit conductor make sensing difficult and are largely determined by the length of a conductor and the number of cores thereon, there is a practical limit to the number of cores coupled by a single conductor. By using two sense-inhibit conductors in parallel at each bit position, the number of cores at each bit position can be doubled so that only half as many inhibit driver circuits are required. This reduction in the number of circuits helps to compensate for the use of more complex and more expensive electronics required for three wire systems compared to four wire systems with separate sense wires and inhibit wires.

However, the use of two sense-inhibit conductors doubles the current to be supplied by each inhibit current driver. At the same time, fast memory operation requires rapid rise of inhibit current to a reasonably well regulated steady state magnitude. The large number of inhibit current drivers and the requirement for double currents make the inhibit drivers one of the most energy demanding systems in a core memory. An inhibit current driver must therefore meet stringent operating requirements at minimum cost and power consumption.

Memory cores present a highly inductive load to a sense-inhibit conductor. Consequently, in order to decrease inhibit current rise time and thereby improve total cycle time it is common to drive a sense-inhibit conductor with an initial voltage that is greater than the voltage required to maintain steady state operation. The simplest way is to use a large series resistor driven from a high voltage source. Initially there is no current flow and the total voltage is applied across the core inductance. Eventually the resistor limits the steady state current. While simple and inexpensive, this arrangement results in large power losses in the resistor. Other arrangements involve switching between high and low voltage but require additional timing and control circuitry which increase the cost.

SUMMARY OF THE INVENTION

A low cost, low power magnetic core memory inhibit driver circuit in accordance with the invention includes a series switch having first and second terminals connected to be selectively opened and closed in response to an inhibit current control signal, a Schottky diode coupled to conduct current from a 5 volt source to the second terminal, first and second groups of more than 8,000 closely spaced magnetic memory cores each, and first and second sense-inhibit conductors of larger cross sectional area than drive conductors of the memory inductively coupled to the first and second groups of cores respectively. The memory cores have sufficiently low current drive requirements, small size and close spacing and the sense-inhibit current conductor size is sufficiently large that the steady state inhibit current can be maintained from a 5 volt source. A large power 5 volt source must typically be provided for integrated circuit logic components anyway and this eliminates the need for a second high power voltage source for the inhibit circuits, thus reducing memory costs.

The first and second sense-inhibit conductors are coupled between the first terminal and ground. The second terminal forms a junction point which is further coupled to a storage capacitor and through a series resistor to a high voltage power source, for example 20 volts. Low peak power demand is made upon the high voltage power source so that an inexpensive DC to DC converter can easily provide the high voltage from the 5 volt source to avoid the need for a separate power supply.

In operation the capacitor charges while the switch is open to provide high voltage energy source for rapid inhibit current rise time upon the switch closure. The series resistor is sufficiently large that little current flows therethrough during switch closure with the vast majority of the steady state inhibit current energy economically emanating from the 5 volt supply. When the switch opens the capacitor charges through the series resistor in preparation for another switch closure. The charging time for a given size of series resistor is reduced by placing inductance in series with the resistor, the capacitor or both.

DESCRIPTION OF THE DRAWINGS

A better understanding of the invention may be had from a consideration of the following Detailed Description, taken in conjunction with the accompanying drawings in which.

DETAILED DESCRIPTION

Figure 1:
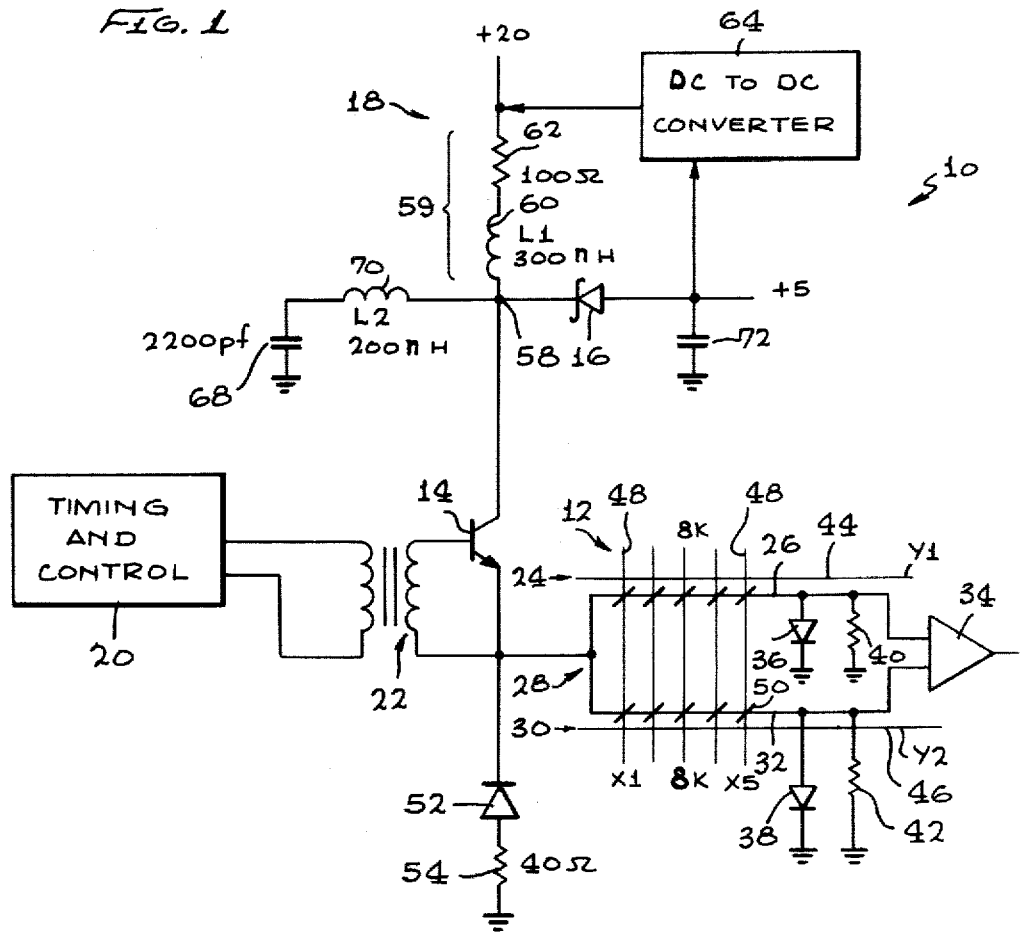
FIG. 1 is a simplified block diagram and schematic representation of a core memory inhibit driver circuit in accordance with the invention.

Referring to FIG. 1, a magnetic core memory inhibit driver circuit 10 in accordance with the invention includes a core matrix 12, a transistor switch 14 having an emitter coupled to provide a inhibit current to the core matrix 12 and a collector coupled through a Schottky diode 16 to a +5 volt source, a voltage boost circuit 18, and timing and control circuitry 20 coupled through a transformer 22 to the base of transistor switch 14 to selectively open and close transistor switch 14.

Core matrix 12 includes a first group of 8,192 (8K) low drive 13 mil outside diameter memory cores 24 such as Ampex 1352 cores inductively coupled to a first sense-inhibit conductor 26 of a sense-inhibit conductor pair 28 and a second similar group of 8,192 (8K) magnetic cores 30 inductively coupled to a second sense-inhibit conductor 32 of the sense-inhibit conductor pair 28. The first sense-inhibit conductor 26 extends between the emitter of transistor 14 and a first differential input of differential sense amplifier 34 while second sense-inhibit conductor 32 extends between the emitter of transistor 14 and a second differential input of differential sense amplifier 34. Diodes 36 and 38 are connected to sense-inhibit conductors 26, 32 respectively, adjacent amplifier 34 to provide a conductive path to ground for inhibit current flowing from transistor switch 14 through the core groups 24 and 30 respectively. Characteristic impedances 40, 42 are also coupled to sense-inhibit conductors 26, 32 adjacent amplifier 34 to limit oscillatory reflection of signals on the sense-inhibit conductors 26, 32.

A Y drive wire 44 is illustrated as running parallel to the first sense-inhibit conductor 26 to inductively couple cores in first group 24 while a second Y drive wire 46 is illustrated as running parallel to second sense-inhibit conductor 32 to couple cores from second group 30. Similarly, five X drive wires 48 labeled X1-X5 are illustrated as extending perpendicular to the Y drive wires and inductively coupling cores from both groups 24, 30. Consequently, a give core such as core 50 at the intersection of drive wire X5 and Y2 can be selected by passing half select currents through each of drive wires X5 and Y2. It will be appreciated that FIG. 1 provides a greatly simplified illustration of the operation of a 3D, three wire core memory and that in reality each of the sense-inhibit conductors 26, 32 meanders through a core memory matrix so as to run parallel at different positions therealong to a large number of Y conductors, each of which extends perpendicular to a large number of X conductors. Additional core matrices having separate sense-inhibit conductor pairs would also typically be present in a memory.

A diode 52 and a 40 ohm resistor 54 are coupled in series to conduct current from ground to the sense-inhibit conductor pair 28 adjacent the emitter of transistor switch 14. The memory cores present a highly inductive load to the sense-inhibit conductor pair and the diode 52 and resistor 54 provide a current path upon the opening of transistor switch 14 during which current can flow as the inductively stored energy of the cores is dissipated. In some arrangements a single 80 ohm resistor has been utilized in place of the diode 52 and 40 ohm resistor 54.

The collector of transistor switch 14 is connected to a junction point 58 at which voltage boost circuit 18 provides an increased voltage prior to the closure of transistor switch 14 during an inhibit or write portion of a memory cycle. The junction point 58 is connected through an impedance 59 having in series combination a 300 nH first inductor 60 and a 100 ohm resistor 62 to a source of relatively high voltage such as 20 volts. In the present example the 20 volts is derived from the +5 volt supply by a DC to DC converter 64. Inductor 60 may be 3 ferrite beads such as Ferroxcube 5659065/43 or an equivalent.

Alternatively, the impedance 59 could be a current source of sufficient magnitude to charge capacitor 68 to the required voltage in the time available between the termination of one inhibit current on interval and initiation of the next. The sourced current magnitude could be about one-half the peak current required for a resistive impedance 59, thus reducing the demand placed upon the high voltage power source. Furthermore, because the peak current with a resistive impedance 59 occurs throughout most of each inhibit current on interval, a substantial power reduction results from use of a current source.

Large quantities of electrical energy at +5 volts are typically required for semiconductor integrated circuits which are used in a core memory. Because of the large energy requirement that already exists, extension of this energy to provide the substantial inhibit currents from the 5 volt source requires very little additional cost. In contrast, in conventional arrangements the substantial inhibit currents must be provided from a voltage source greater than 5 volts and consequently a separate large power voltage source must be provided. This substantially increases the cost over the single large power voltage source required for the present invention. Furthermore, the present invention reduces the power requirements for the 20 volt source to the extent that this voltage can be economically provided by DC to DC converter 64 without a third power supply for this source.

A 2200 pf storage capacitor 68 is coupled through a 200 nH second inductor 70 to the junction point 58. A bypass or filter capacitor 72 is shown as connected between the +5 volt source and ground. Second inductor 70 may be two ferrite beads.

Upon the opening of transistor switch 14, current flows from the +20 volt source through resistor 62 and inductances 60 and 70 to charge capacitor 68 toward +20 volts. Upon closure of the transistor switch 14, the relatively high voltage energy stored by capacitor 68 is presented to the far end of sense-inhibit conductor pair 28 to provide a rapid current rise time for the inhibit current. In this example capacitor 68 has a value of 2200 picofarads which is selected in conjunction with the core inductance and conductor resistances to provide a desired inhibit current rise time waveform. As capacitor 68 discharges to slightly less than 5 volts the diode 16 begins conducting and energy for maintenance of the inhibit current is provided from the +5 volt source. During times when diode 16 is conducting, there appears an extremely low impedance path between capacitor 68 and capacitor 72. As a result, high frequency oscillations tend to appear on this path which might interfere with core memory operations. The second inductance 70 helps reduce the frequency of these oscillations to a value which does not interfere with core memory operation.

Figure 2:
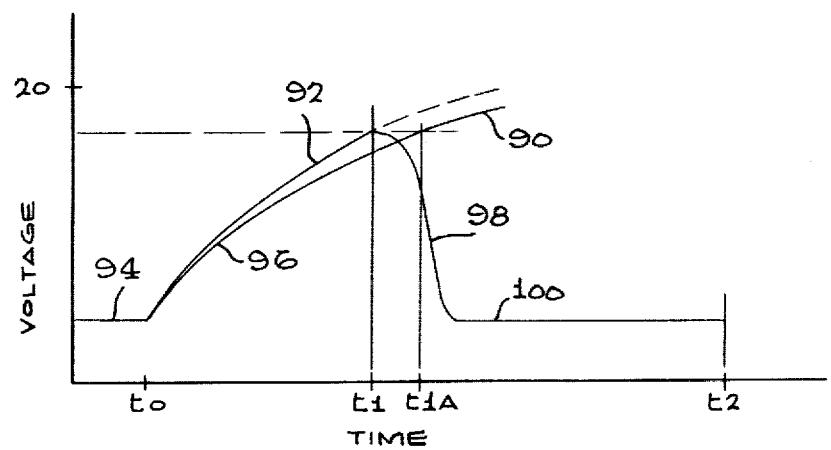
FIG. 2 is an illustration of various waveforms which are useful in understanding the operation of the inhibit current driver circuit shown in FIG. 1.

The operation of the inhibit current driver circuit 10 can be better understood with reference to FIG. 2. Curve 90 illustrates circuit operation with first inductor 60 absent while curve 92 illustrates a somewhat faster operation with first inductor 60 present. Use of inductors 60 and 70 is preferred but not always essential.

At time T0 following an inhibit current interval 94 transistor switch 14 opens to terminate inhibit current therethrough and the voltage at junction point 58 begins rising from slightly below 5 volts and, without first inductor 60 present, exponentially approaches 20 volts as shown by curve 90 as capacitor 68 is charged by current flowing through resistor 62. During this charging time 96 the memory will undergo a read portion of a memory cycle during which a selected core at each bit position is switched to a zero state and the sense-inhibit conductor pair 28 is utilized to carry a small core switching signal in the event that a selected core at that bit position was previously in the one state. By time T1A the junction point 58 has charged to +18 volts or 90% of the maximum 20 volts. Assuming that core memory tolerances permit a new memory write cycle to begin as soon as junction point 58 has charged to 90% of full value, the new memory write cycle could begin at time T1A.

However, the addition of first inductor 60 permits the memory cycle to be speeded up somewhat as illustrated by curve 92. During the preceding write cycle the voltage at junction point 58 stabilizes at approximately 4.7 volts and maximum current flows through resistor 62 and first inductor 60 so that inductor 60 stores a maximum quantum of energy. Upon the opening of transistor switch 14 at time T0 capacitor 68 tends to expotentially charge towards 20 volts. However, the inductively stored energy of inductor 60 supplies additional energy to capacitor 68 to tend to maintain a larger current through first inductor 60 and resistor 62 so that capacitor 68 charges somewhat more rapidly than it would in the absence of first inductor 60. The voltage at junction point 58 now reaches 90% of full value at time T1 which is earlier than time T1a so that memory operation can be faster for a given value of resistor 62.

The charging time 96 can of course be reduced by decreasing the value of the resistor 62, but this results in a greater current flowing from the 20 volt source during the steady state inhibit current interval 94. This not only places a larger power demand on the 20 volt source and Dc to DC converter 64 but also results in greater power loss and heat buildup in resistor 62. It is thus desirable that resistor 62 be as large as possible while permitting the junction point 58 to charge to the minimum acceptable voltage during the time interval of a single read or clear portion of a memory cycle. The insertion of the first inductor 60 permits the resistance resistor 62 to be increased slightly while still accomplishing this goal.

Upon reaching 90% of full voltage at time T1, transistor switch 14 may close to begin a new write portion of a memory cycle. As illustrated by curve segment 98 the voltage at junction 58 experiences a rapid decrease as inhibit current increases until the voltage stabilizes at curve segment 100 at a voltage equal to +5 volts minus the forward bias voltage drop across diode 16. Curve segment 100 is thus comparable to region 94 of the preceding cycle.

While there have been shown and described above alternative arrangements of a core memory inhibit circuit driver in accordance with the invention for the purpose of enabling a person of ordinary skill in the art to make and use the invention, it will be appreciated that the invention is not limited thereto.

Accordingly, any modifications, variations, or equivalent arrangements within the scope of the attached claims should be considered to be within the scope of the invention.

What is claimed is:

1. A core memory inhibit current driver circuit comprising:
   a switch having a first terminal coupled to an inhibit conductor which inductively couples a plurality of magnetic memory cores and a second terminal coupled to a junction, the switch being selectively closed to pass inhibit current therethrough in response to a command signal;
   a diode coupled between the junction and a first voltage source, the diode being oriented to conduct current in the direction of the inhibit current;
   a storage capacitor coupled between the junction and a selected voltage;
   a resistor coupled between the junction and a second voltage source of greater magnitude than the first voltage source.

2. The driver circuit according to claim 1 above, wherein the diode is a Schottky diode.

3. The driver circuit according to claim 1 above, further comprising an inductor coupled in series with said resistor.

4. The driver circuit according to claim 3 above, further comprising a second inductor coupled in series with the capacitor and wherein the capacitor stores sufficient energy when charged to approximately the second voltage to rapidly increase the magnitude of the inhibit current upon closure of the switch within a desired rise time interval to approximately a steady state level which is maintained by energization provided by the first voltage source.

5. The driver circuit according to claim 1 further comprising a series combination of a second resistor and a second diode coupled between the first terminal and ground, the second diode being oriented to conduct current inductively generated by the memory cores upon opening of the switch.

6. A magnetic core memory inhibit current driver circuit comprising:
   a switch having first and second terminals connected to be selectively opened and closed in response to a control signal;
   a diode coupling the second terminal of a 5 volt source and being oriented to conduct inhibit current from the 5 volt source through the switch and a pair of sense-inhibit conductors during a write portion of a memory cycle;
   first and second groups of more than 16,000 magnetic memory cores each;
   first and second sense-inhibit conductors inductively coupled to the first and second groups of cores respectively, each conductor having one end thereof coupled to the first terminal and an opposite end coupled through an impedance to ground and to an input of a differential sense amplifier, the steady state magnitude of the inhibit current of the memory cores being sufficiently low and the resistance of the sense-inhibit conductors being sufficiently low that the steady state magnitude of inhibit current through the first and second sense-inhibit conductors is maintained by energization from the 5 volt source;
   a storage capacitor coupled between the second terminal and a fixed voltage; and
   an impedance coupled between the second terminal and a second voltage source greater than the 5 volt source to rapidly charge the capacitor to a voltage approximating the second source upon opening of the switch, the charged capacitor causing the inhibit current to rapidly rise toward the steady state magnitude upon closure of the switch.

7. The driver circuit according to claim 5 above, wherein said impedance comprises the series combination of an inductance and a resistance.

8. The driver circuit according to claim 6 above, wherein the switch is a transistor.

9. The driver circuit according to claim 6 above, further comprising a second inductor coupled in series with the capacitor.

10. The driver circuit according to claim 7 above, wherein the resistance of said impedance has a magnitude of at least 100 ohms.

* * * * *